United States Patent
Yamanaka et al.

(10) Patent No.: US 8,568,619 B2
(45) Date of Patent: Oct. 29, 2013

(54) GLASS FRIT FOR FORMING ELECTRODE, AND ELECTRICALLY CONDUCTIVE PASTE FOR FORMING ELECTRODE AND SOLAR CELL, UTILIZING SAME

(75) Inventors: Kazuhiko Yamanaka, Tokyo (JP); Yuki Yokoyama, Tokyo (JP); Toru Shimoyama, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 54 days.

(21) Appl. No.: 13/328,650

(22) Filed: Dec. 16, 2011

(65) Prior Publication Data
US 2012/0085404 A1 Apr. 12, 2012

Related U.S. Application Data

(63) Continuation of application No. PCT/JP2010/060239, filed on Jun. 16, 2010.

(30) Foreign Application Priority Data

Jun. 17, 2009 (JP) ................... 2009-144101

(51) Int. Cl.
 H01B 1/22 (2006.01)
 C03C 8/04 (2006.01)
 H01L 21/288 (2006.01)
 H01L 31/04 (2006.01)

(52) U.S. Cl.
 USPC .......................... 252/514; 136/252

(58) Field of Classification Search
 USPC ..................... 252/512–514; 501/79
 See application file for complete search history.

(56) References Cited

U.S. PATENT DOCUMENTS

| | | | |
|---|---|---|---|
| 5,707,909 A * | 1/1998 | Heitmann et al. | 501/59 |
| 7,435,361 B2 | 10/2008 | Carroll et al. | |
| 8,178,453 B2 * | 5/2012 | Tanida et al. | 501/73 |
| 2008/0314444 A1 | 12/2008 | Kawaguchi | |

FOREIGN PATENT DOCUMENTS

| | | |
|---|---|---|
| JP | 2003-020251 | 1/2003 |
| JP | 2006-332032 | 12/2006 |
| JP | 2007-246382 | 9/2007 |
| JP | 2007-281023 | 10/2007 |
| JP | 4182174 | 9/2008 |
| JP | 2009-120462 | 6/2009 |

OTHER PUBLICATIONS

International Search Report issued Sep. 21, 2010 in PCT/JP2010/060239 filed Jun. 16, 2010.

* cited by examiner

*Primary Examiner* — Mark Kopec
(74) *Attorney, Agent, or Firm* — Oblon, Spivak, McClelland, Maier & Neustadt, L.L.P.

(57) ABSTRACT

To provide a glass frit for forming an electrode, to be used for forming a light-receiving surface electrode for a solar cell, which has suitable glass fluidity and Si reactivity required to form a light-receiving surface electrode and a sufficient water resistance.

A glass frit for forming an electrode to be used for forming a light-receiving surface electrode 12 for a solar cell 1, which comprises from 3 mol % to 20 mol % of $SiO_2$, from 10 mol % to 40 mol % of $Bi_2O_3$, from 15 mol % to 45 mol % of $B_2O_3$, from 10 mol % to 60 mol % of ZnO and from 2 mol % to 10 mol % of $Ti_2O$, wherein the total content of $Bi_2O_3$ and ZnO is from 35 mol % to 70 mol %.

8 Claims, 1 Drawing Sheet

GLASS FRIT FOR FORMING ELECTRODE, AND ELECTRICALLY CONDUCTIVE PASTE FOR FORMING ELECTRODE AND SOLAR CELL, UTILIZING SAME

TECHNICAL FIELD

The present invention relates to a glass frit for forming an electrode, which is to be used for forming a light-receiving surface electrode for a solar cell and which contains no lead, and an electrically conductive paste for forming an electrode and a solar cell, utilizing the same.

BACKGROUND ART

Heretofore, as a solar cell utilizing a Si semiconductor, one has been known wherein a semiconductor substrate having a n-type Si semiconductor layer formed on a light-receiving surface side of a p-type Si semiconductor layer is used, and on the light-receiving surface side of this semiconductor substrate, an antireflection layer is formed and a light-receiving surface electrode is also formed, and on the back surface side, a back surface electrode is formed.

The light-receiving surface electrode is formed as follows. That is, on a semiconductor substrate having an antireflection layer formed thereon, an electrically conductive paste comprising an electrically conductive silver powder, a glass frit and an organic vehicle is applied and baked to form a light-receiving surface electrode and to let it penetrate into the antireflection layer to electrically connect it to the semiconductor substrate, particularly to the n-type Si semiconductor layer.

As such a glass frit, one containing lead has been used. One containing lead has a relatively low melting point, and it is capable of sufficiently bonding the semiconductor substrate and the light-receiving surface electrode even when it is fired at a low temperature. However, lead is a hazardous substance, and therefore, one containing no lead is desired.

As a glass frit containing no lead, for example, one comprising from about 40 to 60 mol % of $SiO_2$, from about 5 to 15 mol % of $B_2O_3$ and from about 5 to 20 mol % of $Bi_2O_3$ and further containing at least one member selected from the group consisting of $Al_2O_3$, $TiO_2$, CuO, CaO, BaO, ZnO and $ZrO_2$, has been known (e.g. Patent Document 1).

Further, for example, one comprising from 0.1 to 8 wt % of $SiO_2$, from 8 to 25 wt % of $B_2O_3$ and from 28 to 85 wt % of $Bi_2O_3$ and further containing from 0 to 4 wt % of $Al_2O_3$, from 0 to 1 wt % of CaO, from 0 to 42 wt % of ZnO, from 0 to 4 wt % of $Na_2O$, from 0 to 3.5 wt % of $Li_2O$, from 0 to 3 wt % of $Ag_2O$, from 0 to 4.5 wt % of $Ce_2O$, from 0 to 3.5 wt % of $SnO_2$ and from 0 to 15 wt % of $BiF_3$, has been known (e.g. Patent Document 2).

PRIOR ART DOCUMENTS

Patent Documents

Patent Document 1: Japanese Patent No. 4,182,174
Patent Document 2: JP-A-2006-332032

DISCLOSURE OF INVENTION

Technical Problem

With respect to a glass frit to be used for forming a light-receiving surface electrode for a solar cell, it is required that the glass fluidity at the time of firing is proper i.e. not too low or not too high, so that it is capable of certainly forming a light-receiving surface electrode by firing, and it will not form a glass layer having an excessive thickness to increase the contact resistance between the semiconductor substrate and the light-receiving surface electrode.

Further, in the formation of a light-receiving surface electrode, at the time of firing, Si of the semiconductor substrate and metal oxides of the glass frit contained in the electrically conductive paste will react so that the metal oxides will be reduced, and a part of an electrically conductive silver powder contained in the electrically conductive paste will be melted together therewith, and when cooled subsequently, silver will again precipitate, so that the semiconductor substrate and the electrically conductive silver powder will be substantially in contact with each other. At that time, it is preferred that precipitated silver will be in contact only with a n-type Si semiconductor layer of the semiconductor substrate and will not be in contact with a p-type Si semiconductor layer, so that a leak current or the contact resistance between the semiconductor substrate and the light-receiving surface electrode can be minimized.

In order to let precipitated silver be in contact only with the n-type Si semiconductor layer of the semiconductor substrate and not to let it be in contact with the p-type Si semiconductor layer, the precipitation of silver is required to be proper i.e. not too much or not too less, and for this purpose, as a prerequisite, the reactivity between Si of the semiconductor substrate and the glass frit (hereinafter referred to as the Si reactivity) is required to be proper i.e. not too high or not too low.

In the case of a conventional glass frit containing lead, it exhibits a proper glass fluidity by firing, whereby the light-receiving surface electrode can certainly be formed, and it is also possible to prevent the glass layer from becoming excessively thick and to obtain one having a small contact resistance. Further, such a glass frit exhibits a proper Si reactivity, whereby it is possible to let precipitated silver be in contact only with the n-type Si semiconductor layer of the semiconductor substrate and not to let it be in contact with the p-type Si semiconductor layer, and to minimize the leak current or the contact resistance.

However, in the case of a glass frit containing no lead, it may remain in a powder form without being sintered, or even if it is sintered, the glass fluidity is likely to be too small, and the bond strength between the semiconductor substrate and the light-receiving surface electrode is likely to be insufficient, or on the contrary, the glass fluidity is likely to be too much, and a glass layer having an excessive thickness is likely to be formed between the semiconductor substrate and the light-receiving surface electrode, whereby the contact resistance tends to be large. Further, it does not necessarily exhibit a proper Si reactivity, whereby precipitated silver may not be in contact with the n-type Si semiconductor layer of the semiconductor substrate, or beyond this n-type Si semiconductor layer, it is likely to be in contact with the p-type Si semiconductor layer, whereby the leak current or the contact resistance tends to increase.

Further, a solar cell is usually used outdoors for a long period of time, and therefore, a glass frit to be used for such a solar cell is required to be excellent in the reliability such as the water resistance. In this respect, a conventional glass frit containing lead has a good water resistance, etc., but a glass frit containing no lead does not necessarily have a sufficient water resistance, etc.

The present invention has been made to solve the above problem, and it is an object of the present invention to provide a glass frit for forming an electrode containing no lead, to be used for forming a light-receiving surface electrode for a solar cell, which has proper glass fluidity and Si reactivity and which also has sufficient water resistance. Further, it is another object of the present invention to provide an electrically conductive paste for forming an electrode to be used for forming a light-receiving surface electrode for a solar cell, which contains the above-mentioned glass frit for forming an electrode of the present invention. A further object of the present invention is to provide a solar cell produced by using such an electrically conductive paste for forming an electrode of the present invention.

Solution to Problem

The glass frit for forming an electrode of the present invention is one to be used for forming a light-receiving surface electrode for a solar cell, which comprises from 3 mol % to 20 mol % of $SiO_2$, from 10 mol % to 40 mol % of $Bi_2O_3$, from 15 mol % to 45 mol % of $B_2O_3$, from 10 mol % to 60 mol % of ZnO and from 2 mol % to 10 mol % of $Ti_2O$, wherein the total content of $Bi_2O_3$ and ZnO is from 35 mol % to 70 mol %.

The glass frit for forming an electrode of the present invention is one which does not contain an alkali metal oxide, an alkaline earth metal oxide, iron oxide and aluminum oxide. Further, the glass frit for forming an electrode of the present invention preferably has a flow button diameter of from 20 mm to 32 mm, representing the glass fluidity at 700° C., and it preferably has an extraction water conductivity of at most 20 μS/cm and preferably has a Si reactivity of from 2 to 9, as determined by utilizing DTA (differential thermal analysis).

The electrically conductive paste for forming an electrode of the present invention is one to be used for forming a light-receiving surface electrode for a solar cell, which comprises an electrically conductive silver powder, a glass frit and an organic vehicle, wherein the glass frit contains the above-mentioned glass frit for forming an electrode of the present invention.

The solar cell of the present invention comprises a semiconductor substrate, a light-receiving surface electrode provided on a light-receiving surface side of the semiconductor substrate, and a back surface electrode provided on the back surface side of the semiconductor substrate, wherein the light-receiving surface electrode is one formed by baking the above-mentioned electrically conductive paste for forming an electrode of the present invention.

Advantageous Effects of Invention

According to the present invention, by adjusting the composition of a glass frit for forming an electrode to be the prescribed one, it is possible to obtain a glass frit for forming an electrode which has proper glass fluidity and Si reactivity as well as sufficient water resistance and which is suitable for forming a light-receiving surface electrode for a solar cell.

Further, according to the present invention, by preparing an electrically conductive paste for forming an electrode by using such a glass frit for forming an electrode, it is possible to obtain an electrically conductive paste for forming an electrode which is suitable for forming a light-receiving surface electrode for a solar cell.

Further, according to the present invention, by baking such an electrically conductive paste for forming an electrode to form a light-receiving surface electrode thereby to form a solar cell, it is possible to obtain a solar cell which is excellent in the reliability such as the conversion efficiency or water resistance.

EMBODIMENTS OF INVENTION

Figure 1:
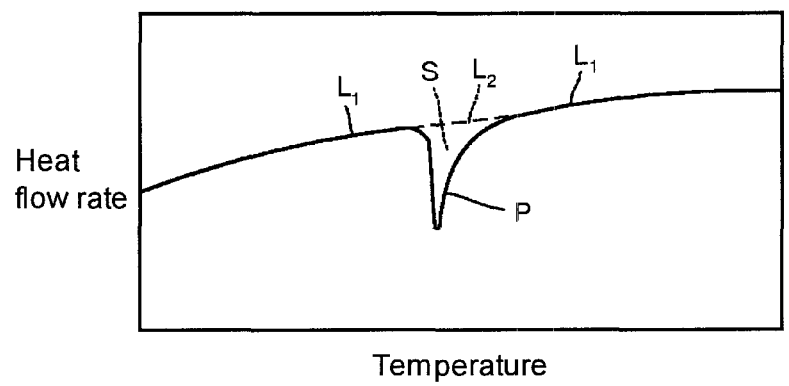
FIG. 1 is a graph illustrating a peak area of an endothermic peak by DTA to be used for the calculation of the Si reactivity.

Now, the present invention will be described in detail.

The glass frit for forming an electrode of the present invention is one to be used for forming a light-receiving surface electrode for a solar cell, which comprises from 3 mol % to 20 mol % of $SiO_2$, from 10 mol % to 40 mol % of $Bi_2O_3$, from 15 mol % to 45 mol % of $B_2O_3$, from 10 mol % to 60 mol % of ZnO and from 2 mol % to 10 mol % of $Ti_2O$, wherein the total content of $Bi_2O_3$ and ZnO is from 35 mol % to 70 mol %.

The respective components of the above composition of the glass frit for forming an electrode of the present invention and their proportions (represented by mol %) will be described below.

$SiO_2$ is a component to form glass and is incorporated to form stabilized glass by coexistence with $B_2O_3$ as another glass-forming component and to improve the water resistance. Such $SiO_2$ is incorporated in a proportion of from 3 mol % to 20 mol % in the glass frit for forming an electrode. If the content of $SiO_2$ is less than 3 mmol %, the water resistance is likely to be inadequate. On the other hand, if the content of $SiO_2$ exceeds 20 mol %, the softening point of glass tends to be high, whereby the fluidity deteriorates, and the bond strength between the semiconductor substrate and the light-receiving surface electrode may not be sufficient. A preferred content of $SiO_2$ is from 4 mol % to 19 mol %, and a more preferred content is from 5 mol % to 18 mol %.

$Bi_2O_3$ is incorporated to improve the softening fluidity of glass and to improve the bond strength between the semiconductor substrate and the light-receiving surface electrode. Such $Bi_2O_3$ is incorporated in a proportion of from 10 mol % to 40 mol % in the glass frit for forming an electrode. If the content of $Bi_2O_3$ is less than 10 mol %, the softening point of glass tends to be high, whereby the fluidity is likely to deteriorate, and the bond strength between the semiconductor substrate and the light-receiving surface electrode may not be sufficient. On the other hand, if the content of $Bi_2O_3$ exceeds 40 mol %, the fluidity of glass tends to be too high, and the glass layer between the semiconductor substrate and the light-receiving surface electrode, particularly the conductive silver powder, tends to be thick, whereby their contact resistance tends to be high. A preferred content of $Bi_2O_3$ is from 12 mol % to 37 mol %, and a more preferred content is from 15 mol % to 35 mol %.

$B_2O_3$ is a component to form glass and is incorporated to form stabilized glass by coexistence with $SiO_2$ as another glass-forming component. Such $B_2O_3$ is incorporated in a proportion of from 15 mol % to 45 mol % in the glass frit for forming an electrode. If the content of $B_2O_3$ is less than 15 mol %, formation of glass is likely to be difficult. On the other hand, if the content of $B_2O_3$ exceeds 45 mol %, the water resistance is likely to be inadequate. A preferred content of $B_2O_3$ is from 15 mol % to 43 mol %, and a more preferred content is from 15 mol % to 40 mol %.

ZnO is incorporated to stabilize glass. Such ZnO is incorporated in a proportion of from 10 mol % to 60 mol % in the glass frit for forming an electrode. If the content of ZnO is less than 10 mol %, devitrification is likely to occur, whereby glass may not be obtainable. On the other hand, if the content of ZnO exceeds 60 mol %, due to crystallization, glass may not be obtainable. A preferred content of ZnO is from 12 mol % to 55 mol %, and a more preferred content is from 13 mol % to 50 mol %.

$TiO_2$ is incorporated to suppress excessive glass fluidity and Si reactivity. Such $TiO_2$ is incorporated in a proportion of from 2 mol % to 10 mol % in the glass frit for forming an electrode. If the content of $TiO_2$ is less than 2 mol %, it may not be possible to suppress excessive glass fluidity and Si reactivity. On the other hand, if the content of $TiO_2$ exceeds 10 mol %, devitrification is likely, whereby glass may not be obtained. A preferred content of $TiO_2$ is from 2 mol % to 9 mol %, and a more preferred content is from 2 mol % to 8 mol %.

The above-described $Bi_2O_3$ and ZnO are incorporated in the above-described respective content ranges provided that their total amount i.e. the total content of $Bi_2O_3$ and ZnO will be from 35 mol % to 70 mol %. If the total content of $Bi_2O_3$ and ZnO is less than 35 mol % or more than 70 mol %, even if the respective contents of $Bi_2O_3$ and ZnO are within the above mentioned proper ranges, the glass fluidity and the Si reactivity will not necessarily be proper, and also the water resistance may not be sufficient. A more preferred range of the total content of $Bi_2O_3$ and ZnO is from 37 mol % to 68 mol %.

With respect to the glass frit for forming an electrode to be used for forming a light-receiving surface electrode for a solar cell of the present invention, a more preferred glass frit composition comprises from 4 mol % to 19 mol % of $SiO_2$, from 12 mol % to 37 mol % of $Bi_2O_3$, from 15 mol % to 43 mol % of $B_2O_3$, from 12 mol % to 55 mol % of ZnO and from 2 mol % to 9 mol % of $Ti_2O$, wherein the total content of $Bi_2O_3$ and ZnO is from 37 mol % to 68 mol %.

To the glass frit for forming an electrode of the present invention, additional oxides may be incorporated in addition to $SiO_2$, $Bi_2O_3$, $B_2O_3$, ZnO and $TiO_2$ as the above described essential components. Such additional oxides may, for example, be $V_2O_5$, $MnO_2$, CoO, NiO, $P_2O_5$, CuO, $ZrO_2$, $CeO_2$, $La_2O_3$, $SnO_2$, etc. Only one of them may be incorporated, or two or more of them may be incorporated, and they may be incorporated so that their total content in the glass frit for an electrode will be at most 10 mol %.

Further, the glass frit for forming an electrode of the present invention may not contain any one of an alkali metal oxide, an alkaline earth metal oxide and iron oxide. If they are contained, it is likely that at the time of firing to form a light-receiving surface electrode, such metal components will diffuse as impurities into the semiconductor substrate, whereby the conversion efficiency of a solar cell tends to be deteriorated.

Further, to the glass frit for an electrode of the present invention, also aluminum oxide ($Al_2O_3$) may not be incorporated. Also in a case where aluminum oxide is incorporated, it is likely that at the time of firing to form a light-receiving surface electrode, Al (aluminum) elements tend to diffuse into the semiconductor substrate to offset the effects of P (phosphorus) elements present in the n-layer thereby to lower the conversion efficiency of a solar cell.

According to the glass frit for forming an electrode of the present invention, by containing the prescribed amounts of $SiO_2$, $Bi_2O_3$, $B_2O_3$, ZnO and $TiO_2$ as the essential components and not substantially containing an alkali metal oxide, an alkaline earth metal oxide, iron oxide and aluminum oxide, it is possible to obtain one having suitable glass fluidity and Si reactivity, and sufficient water resistance, required to form a light-receiving surface electrode with little leak current or contact resistance.

Specifically, it is possible to obtain one having a flow button diameter of from 20 mm to 32 mm representing the glass fluidity at 700° C., a Si reactivity of from 2 to 9 as determined by utilizing DTA (differential thermal analysis) and an extraction water conductivity of at most 20 μS/cm as an index for water resistance.

The flow button diameter is one which becomes an index to represent the glass fluidity of the glass frit for forming an electrode, and specifically, it is one which becomes an index to represent the glass fluidity of the glass frit for forming an electrode at the time of firing to form a light-receiving surface electrode. If the flow button diameter (700° C.) is less than 20 mm, the glass fluidity tends to be too low, whereby the bond strength between the semiconductor substrate and the light-receiving surface electrode tends to be inadequate. On the other hand, if the flow button diameter (700° C.) exceeds 32 mm, the glass fluidity tends to be too high, whereby the glass layer between the semiconductor substrate and the light-receiving surface electrode, particularly the electrically conductive silver powder, tends to be thick, and the contact resistance tends to be large.

Such a flow button diameter is one obtained by press-forming a prescribed amount of a glass frit for forming an electrode to be measured to obtain a columnar formed product for evaluation having a diameter of 12.7 mm (½ inch), holding the formed product at 700° C. for 10 minutes to let it flow, followed by measuring the diameter.

The extraction water conductivity is one which becomes an index for the reliability, specifically the water resistance, of the glass frit for forming an electrode. If the extraction water conductivity exceeds 20 μS/cm, elution of the constituting components from the glass frit for forming an electrode tends to be too much, whereby the water resistance tends to be inadequate. Such an extraction water conductivity is one obtained by adding the glass frit for forming an electrode to ion-exchanged water so that the proportion of the ion-exchanged water will be 99 vol %, and the proportion of the glass frit for forming an electrode will be 1 vol %, followed by shaking at 25° C. for 60 minutes to prepare extraction water, and then measuring the electrical conductivity of this extraction water.

The Si reactivity is one which becomes an index to represent the reactivity of the glass frit for forming an electrode with Si. If the Si reactivity is less than 2, the Si reactivity is too low, whereby at the time of forming a light-receiving surface electrode, precipitation of silver utilizing this reaction tends to be inadequate, and the semiconductor substrate, particularly the n-type Si semiconductor layer, and the electrically conductive silver powder tend to be not in contact with each other, whereby the contact resistance tends to be large. On the other hand, if the Si reactivity exceeds 9, the Si reactivity tends to be too high, whereby at the time of forming a light-receiving surface electrode, precipitation of silver utilizing this reaction tends to be excessive, and the p-type Si semiconductor layer of the semiconductor substrate, and the electrically conductive silver powder, tend to be in contact with each other, whereby the leak current tends to be substantial. Here, the Si reactivity is used for the convenience for evaluation of the reactivity with Si with respect to the glass frit for forming an electrode different in the composition and is not one which necessarily has a physical significance.

The Si reactivity is one obtained as follows. Firstly, with respect to a mixed powder for evaluation having 82 vol % of a glass frit for forming an electrode and 18 vol % of Si powder mixed, heat treatment is carried out at 800° C. for 10 minutes to obtain a glass for evaluation. Then, with respect to this glass for evaluation, data for endothermic peaks attributable to melting points of metals precipitated by reduction of metal oxides in the glass frit for forming an electrode, by the above mentioned heat treatment, are collected, and the peak areas are obtained.

FIG. 1 is one wherein an example of the endothermic peak P and its peak area S thus measured, is schematically illustrated. Specifically, the peak area S is an area of the portion defined by a substantially linear virtual baseline having a baseline $L_1$ extended to the peak portion and a curve representing the endothermic peak P. Usually, the peak area S can easily be obtained by a function associated with a measuring instrument of DTA.

The peak area thus obtained is divided by the specific gravity of the glass for evaluation and then further divided by the heat of fusion of the above-mentioned metal (the metal precipitated by reduction of the metal oxide in the glass frit for forming an electrode) to calculate a value which will be the Si reactivity. Here, the specific gravity of the glass for evaluation can be calculated from the mixed ratio of the mixed powder for evaluation and is one which should be called also as the average specific gravity.

For such a glass frit for forming an electrode, starting material powders of the respective components are blended in prescribed proportions so that $SiO_2$, $Bi_2O_3$, $B_2O_3$, ZnO and $TiO_2$ as the above-described essential components will be the above-described compositional proportions, and as the case requires, starting material powders of additional components such as $V_2O_5$, $MnO_2$, CoO, NiO, $P_2O_5$, CuO, $ZrO_2$, $CeO_2$, $La_2O_3$, $SnO_2$, etc. are also blended, followed by mixing thoroughly and then by melting, for example, at a temperature of from 1,200° C. to 1,400° C. for a period of from 10 minutes to 120 minutes, to obtain a desired glass. Thereafter, the obtained glass is further cooled and pulverized, whereby a glass frit can easily be obtained.

The glass frit for forming an electrode thus obtained is preferably one having, for example, a mass average particle diameter $D_{50}$ of from 0.5 μm to 15 μm. If the mass average particle diameter $D_{50}$ is less than 0.5 μm, the storage stability tends to be low, such being undesirable. On the other hand, if the mass average particle diameter $D_{50}$ exceeds 15 μm, the sinterability tends to be low, such being undesirable. The average particle diameter $D_{50}$ in this specification is meant for one measured by means of a laser diffraction/scattering type particle size distribution measuring apparatus.

The electrically conductive paste for forming an electrode of the present invention is one which contains such a glass frit for forming an electrode of the present invention. Specifically, it comprises an electrically conductive silver powder, a glass frit and an organic vehicle, wherein at least a part, preferably all, of this glass frit is made of the glass frit for forming an electrode of the present invention. Here, the electrically conductive silver powder includes a powder of an electrically conductive silver alloy.

As the electrically conductive silver powder to be contained in the electrically conductive paste for forming an electrode, the shape is not particularly limited, and it may be spherical or scaly. Further, the electrically conductive silver powder may be composed of one type of shape or a plurality of shapes. The size of the electrically conductive silver powder is also not particularly limited, but, for example, one having a mass average particle diameter $D_{50}$ of from 0.1 μm to 15 μm may suitably be employed. If the mass average particle diameter $D_{50}$ exceeds 15 μm, the contact between the semiconductor substrate and the light-receiving surface electrode, particularly the electrically conductive silver powder, tends to be inadequate, whereby the contact resistance tends to increase.

As the organic vehicle, it is possible to employ an organic resin binder which is commonly used for an electrically conductive paste for forming an electrode of this type, and for example, ethyl cellulose, nitro cellulose or the like may be employed.

To the electrically conductive paste for forming an electrode of the present invention, in addition to the above-described electrically conductive silver powder, glass frit and organic vehicle, known additives may be incorporated, as the case requires, within a range not to impair the purpose of the present invention.

As such additives, it is possible to use, for example, inorganic oxides such as ZnO, $TiO_2$, $Ag_2O$, $WO_3$, $V_2O_5$, $Bi_2O_3$, $ZrO_2$, etc. Such inorganic oxides serve to accelerate decomposition of an antireflection layer preliminarily formed on the surface of the semiconductor substrate, at the time of firing the electrically conductive paste and to lower the contact resistance between the light-receiving surface electrode and the semiconductor substrate. The size of additives made of such inorganic oxides is not particularly limited, but, for example, one having a mass average particle diameter $D_{50}$ of at most 1.0 μm may be suitably employed.

Further, as an additive, a resinate containing a metal or metal compound may, for example, be used, and as such a metal or metal compound, it is possible to use, for example, at least one metal selected from Zn, Bi and Ti or its metal compound. By adding a metal or metal compound in the form of a resinate to the electrically conductive paste, it is possible to more uniformly disperse the metal component than a case where it is added in the form of an inorganic powder.

The electrically conductive paste for forming an electrode can be prepared by adding the electrically conductive silver powder, the glass frit and, as the case requires, additives such as inorganic oxides, to an organic vehicle solution obtainable by dissolving an organic resin binder as an organic vehicle in a solvent, followed by kneading thoroughly.

The content of the glass frit in the electrically conductive paste for forming an electrode, is preferably from 1 part by mass to 8 parts by mass, per 100 parts by mass of the electrically conductive silver powder. If the content of the glass frit is less than 1 part by mass, the bond strength between the semiconductor substrate and the light-receiving surface electrode tends to be inadequate. On the other hand, if the content of the glass frit exceeds 8 parts by mass, the contact between the semiconductor substrate and the light-receiving surface electrode, particularly the electrically conductive silver powder, tends to be inadequate, and the contact resistance tends to increase.

Further, the content of the organic vehicle in the electrically conductive paste for forming an electrode is preferably from 10 parts by mass to 25 parts by mass per 100 parts by mass of the electrically conductive silver powder. If the content of the organic vehicle is less than 10 parts by mass, formation of the paste tends to be difficult. On the other hand, if the content of the organic vehicle exceeds 25 parts by mass, bleeding is likely to occur at the time of screen printing.

Further, in a case where an inorganic oxide is incorporated as an additive, its content is preferably e.g. from 3 parts by mass to 15 parts by mass, per 100 parts by mass of the electrically conductive silver powder. If the content of the inorganic oxide is less than 3 parts by mass, no adequate effect will be obtained by adding the additive made of the inorganic oxide. On the other hand, if the content of the additive made of the inorganic oxide exceeds 15 parts by mass, such may impair sintering of the electrically conductive paste for forming an electrode.

Further, in a case where a resinate containing a metal or metal compound is incorporated as an additive, its content is preferably e.g. from 8 parts by mass to 16 parts by mass, per 100 parts by mass of the electrically conductive silver powder.

Figure 2:
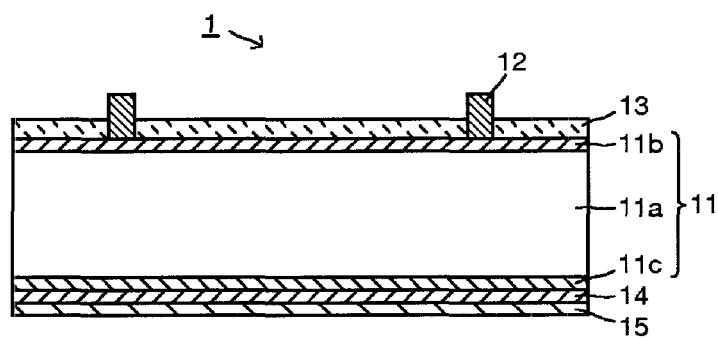
FIG. 2 is a cross sectional view showing an embodiment of the solar cell of the present invention.

The solar cell of the present invention is one wherein a light-receiving surface electrode is formed by baking such an electrically conductive paste for forming an electrode. FIG. 2 is a schematic cross sectional view showing an embodiment of the solar cell 1 of the present invention.

The solar cell 1 has a semiconductor substrate 11 having a n-type Si semiconductor layer 11b formed by thermal diffusion of e.g. P (phosphorus) on the light-receiving surface side (the upper side in Fig.) of a p-type Si semiconductor layer 11a. On the light-receiving surface side of this semiconductor substrate 11, a light-receiving surface electrode 12 is formed by baking the electrically conductive paste for forming an electrode of the present invention. Further, on the light-receiving surface side of this semiconductor substrate 11, an antireflection layer 13 is formed substantially on the entire surface except for the light-receiving surface electrode 12. The antireflection layer 13 is provided to lower the surface reflectance against an incident light thereby to improve the conversion efficiency of the solar cell 1, and it is one made of, for example, silicon nitride, titanium oxide or silicon oxide.

On the other hand, on the back surface side of the semiconductor substrate 11, an aluminum back surface electrode 14 is formed, and at the same time, a $p^+$ layer 11c so-called a back surface field (BSF) layer is formed at the surface portion of the semiconductor substrate 11 with which the aluminum back surface electrode 14 is in contact. Further, on the aluminum back surface electrode 14, a silver or silver/aluminum back surface electrode 15 is formed to make soldering possible, since the aluminum back surface electrode 14 is otherwise hardly susceptible to soldering for mutual connection to another solar cell.

Such a solar cell 1 can be produced by using a known method for producing a solar cell, except that the electrically conductive paste for forming an electrode of the present invention is employed for the formation of the light-receiving surface electrode 12.

That is, by using a p-type substrate, and by diffusing P (phosphorus) by using e.g. phosphorus oxychloride ($POCL_3$), it is possible to obtain a semiconductor substrate 11 having a n-type Si semiconductor layer 11b formed on the light-receiving surface side of the p-type Si semiconductor layer 11a. Over the substantially entire surface on the light-receiving surface side of this semiconductor substrate 11, an antireflection layer 13 made of e.g. silicon nitride, titanium oxide or silicon oxide is formed. The formation of the antireflection layer 13 may be carried out, for example, by low pressure CVD, plasma CVD or thermal CVD.

Then, on the light-receiving surface side of the semiconductor substrate 11 having such an antireflection layer 13 formed, the electrically conductive paste for forming an electrode of the present invention is screen-printed in a prescribed shape and dried. Further, on the back surface side of the semiconductor substrate 11, a back surface aluminum paste to form the aluminum back surface electrode 14 is screen-printed, and further, a back surface silver paste to form the silver or silver/aluminum back surface electrode 15 is screen-printed and dried.

Thereafter, the semiconductor substrate 11 is fired at a temperature of e.g. from 600° C. to 900° C., whereby the electrically conductive paste for forming an electrode on the light-receiving surface side is sintered to form a light-receiving surface electrode 12, and at the same time, it penetrates into the antireflection layer 13, so that the n-type Si semiconductor layer 11b of the semiconductor substrate 11 and the light-receiving surface electrode 12, particularly the electrically conductive silver powder, are electrically connected.

On the other hand, also the back surface aluminum paste on the back surface side is fired to form an aluminum back surface electrode 14, and at the same time, from the back side aluminum paste, aluminum diffuses as an impurity to the semiconductor substrate 11, whereby a $p^+$ layer 11c containing an aluminum dopant at a high concentration is formed. Further, at the same time, the back surface silver paste is fired to form a silver or silver/aluminum back surface electrode 15.

At that time, the glass frit for forming an electrode on the light-receiving surface side has proper glass fluidity, whereby the bond strength between the semiconductor substrate 11 and the light-receiving surface electrode 12 becomes sufficient, and formation of an excessive glass layer between them is also suppressed, so that the contact resistance becomes small. Further, the glass frit for forming an electrode has a proper Si reactivity, whereby silver will precipitate so that it will be in contact only with the n-type Si semiconductor layer 11b of the semiconductor substrate 11, and the n-type Si semiconductor layer 11b of the semiconductor substrate 11 and the light-receiving surface electrode 12, particularly the electrically conductive silver powder will be in good contact with each other to minimize the contact resistance or leak current. Further, the glass frit for forming an electrode has sufficient water resistance, whereby the water resistance of the light-receiving surface electrode 12 also becomes sufficient. It is thereby possible to obtain a solar cell 1 excellent in the conversion efficiency and reliability.

EXAMPLES

Now, the present invention will be described in further detail with reference to Examples.

Examples 1 to 18 and Comparative Examples 1 to 13

As a glass frit for forming an electrode in each of Examples 1 to 18 and Comparative Examples 1 to 13, one having the composition shown in Table 1 was produced. That is, raw material powders were blended and mixed to obtain the composition shown in Table 1, and the mixture was melted in an electric furnace of from 1,200 to 1,400° C. for one hour by means of a platinum crucible and then formed into a thin plate-form glass. Then, this thin plate-form glass was pulverized by a ball mill and classified by an air classifier so that the mass average particle diameter $D_{50}$ would be from 0.5 to 1.5 μm, thereby to obtain a glass frit for an electrode in each of Examples 1 to 18 and Comparative Examples 1 to 13.

Here, each glass frit for forming an electrode in each of Comparative Examples 1 to 13 contained no lead, and particularly, the glass frit for forming an electrode in each of Comparative Examples 1 to 7 was one having a large content of $SiO_2$, and the glass frit for forming an electrode in each of Comparative Examples 8 to 13 was one having a relatively small content of $SiO_2$ and containing no $TiO_2$. Further, in Table 1, a common glass frit for forming an electrode containing lead is also shown (Reference Example) as one serving as the evaluation standard for the glass frit for forming an electrode in each of Examples and Comparative Examples.

Then, with respect to the glass frit for forming an electrode in each of Examples 1 to 18 and Comparative Examples 1 to 13, evaluations of the glass fluidity, water resistance and Si reactivity were carried out as follows. Further, for the purpose of comparison, also with respect to the glass frit for forming an electrode in Reference Example, evaluations were carried out in the same manner. The results were shown in Table 1.
(Glass Fluidity)

As the glass fluidity, a flow button diameter was measured. That is, the glass frit for forming an electrode was weighed so that the volume became 1 cm³, followed by press forming to prepare a columnar formed product for evaluation having a diameter of 12.7 mm. Such a formed product for evaluation was subjected to firing for 10 minutes at a firing temperature of 500° C., 600° C. or 700° C. by means of a batch firing furnace to let it flow, whereupon the diameter after flowing was measured. In Table, "x" shows that the formed product for evaluation was not sintered and remained in the form of a powder.

(Water Resistance)

As the water resistance, an extraction water conductivity was measured. That is, a glass frit for forming an electrode was added to ion-exchanged water so that the proportion of the ion exchanged water became 99 vol % and the proportion of the glass frit for forming an electrode became 1 vol %, followed by shaking at 25° C. for 60 minutes by means of a shaker to prepare extraction water. Then, with respect to this extraction water, the electrical conductivity was measured. Here, with respect to the glass frit for forming an electrode in some of the Comparative Examples, this evaluation was not carried out, since evaluation of the water resistance was unnecessary for such a reason that, for example, the glass fluidity was inadequate.

(Si Reactivity)

82 vol % of a glass frit for forming an electrode and 18 vol % of a Si powder (manufactured by Kojundo Chemical Laboratory Co., Ltd.) were thoroughly mixed in a mortar to obtain a mixed powder for evaluation. Then, this mixed powder for evaluation was put into an alumina cell and subjected to thermal treatment at 800° C. for 10 minutes by means of a batch firing furnace, to obtain glass for evaluation. Then, with respect to this glass for evaluation, data of an endothermic peak attributable to the melting point of a metal precipitated by reduction of a metal oxide in the glass frit for forming an electrode by the previous thermal treatment, were collected by DTA, and its peak area was obtained.

This peak area of the endothermic peak was divided by the specific gravity of the glass for evaluation calculated from the mixed ratio of the mixed powder for evaluation and then further divided by the heat of fusion of the metal precipitated by the previous thermal treatment to calculate a value which becomes an index for the Si reactivity. Here, with respect to the glass frit for forming an electrode in some of Comparative Examples, no evaluation was carried out, since evaluation of the Si reactivity was unnecessary for such a reason that, for example, the glass fluidity was inadequate.

TABLE 1

| | Composition (mol %) | | | | | | | | | | | | | | | | $Bi_2O_3$ + ZnO (mol %) |
|---|---|---|---|---|---|---|---|---|---|---|---|---|---|---|---|---|---|
| | $SiO_2$ | $Bi_2O_3$ | PbO | $B_2O_3$ | ZnO | CaO | BaO | $Li_2O$ | $Na_2O$ | $SnO_2$ | $Al_2O_3$ | $CeO_2$ | CuO | $ZrO_2$ | $TiO_2$ | Total | |
| Ref. Ex. | 51.9 | | 33.2 | 14.9 | | | | | | | | | | | | 100.0 | 0.0 |
| Ex. 1 | 16.5 | 15.0 | | 24.8 | 41.2 | | | | | | | | | | 2.5 | 100.0 | 56.2 |
| Ex. 2 | 8.3 | 15.0 | | 24.7 | 49.5 | | | | | | | | | | 2.5 | 100.0 | 64.5 |
| Ex. 3 | 8.3 | 15.0 | | 33.0 | 41.2 | | | | | | | | | | 2.5 | 100.0 | 56.2 |
| Ex. 4 | 16.0 | 15.0 | | 24.0 | 40.0 | | | | | | | | | | 5.0 | 100.0 | 55.0 |
| Ex. 5 | 8.0 | 15.0 | | 24.0 | 48.0 | | | | | | | | | | 5.0 | 100.0 | 63.0 |
| Ex. 6 | 8.0 | 15.0 | | 32.0 | 40.0 | | | | | | | | | | 5.0 | 100.0 | 55.0 |
| Ex. 7 | 15.5 | 20.0 | | 31.0 | 31.0 | | | | | | | | | | 2.5 | 100.0 | 51.0 |
| Ex. 8 | 15.5 | 20.0 | | 23.3 | 38.7 | | | | | | | | | | 2.5 | 100.0 | 58.7 |
| Ex. 9 | 7.8 | 20.0 | | 31.0 | 38.7 | | | | | | | | | | 2.5 | 100.0 | 58.7 |
| Ex. 10 | 7.8 | 20.0 | | 38.8 | 31.0 | | | | | | | | | | 2.5 | 100.1 | 51.0 |
| Ex. 11 | 15.0 | 20.0 | | 30.0 | 30.0 | | | | | | | | | | 5.0 | 100.0 | 50.0 |
| Ex. 12 | 15.0 | 20.0 | | 22.5 | 37.5 | | | | | | | | | | 5.0 | 100.0 | 57.5 |
| Ex. 13 | 7.5 | 20.0 | | 30.0 | 37.5 | | | | | | | | | | 5.0 | 100.0 | 57.5 |
| Ex. 14 | 7.5 | 20.0 | | 37.5 | 30.0 | | | | | | | | | | 5.0 | 100.0 | 50.0 |
| Ex. 15 | 13.0 | 30.0 | | 39.0 | 13.0 | | | | | | | | | | 5.0 | 100.0 | 43.0 |
| Ex. 16 | 13.0 | 30.0 | | 32.5 | 19.5 | | | | | | | | | | 5.0 | 100.0 | 49.5 |
| Ex. 17 | 6.5 | 30.0 | | 39.0 | 19.5 | | | | | | | | | | 5.0 | 100.0 | 49.5 |
| Ex. 18 | 6.5 | 30.0 | | 32.5 | 26.0 | | | | | | | | | | 5.0 | 100.0 | 56.0 |
| Comp. Ex. 1 | 56.7 | 13.6 | | 15.0 | | | | | | | 10.0 | | | | 4.7 | 100.0 | 13.6 |
| Comp. Ex. 2 | 51.1 | 17.0 | | 12.8 | | | 17.0 | | | | | | | | 2.1 | 100.0 | 17.0 |
| Comp. Ex. 3 | 43.3 | 19.7 | | 11.8 | | | 15.8 | | | | 9.5 | | | | | 100.1 | 19.7 |
| Comp. Ex. 4 | 52.2 | 17.4 | | 13.0 | | | 17.4 | | | | | | | | | 100.0 | 17.4 |
| Comp. Ex. 5 | 49.5 | 18.0 | | 4.5 | | | 18.0 | | | | 9.9 | | | | | 99.9 | 18.0 |
| Comp. Ex. 6 | 49.9 | 0.0 | | 14.5 | 1.9 | 4.7 | 22.5 | | | | 2.8 | | | 2.4 | 1.3 | 100.0 | 1.9 |
| Comp. Ex. 7 | 54.7 | 13.6 | | 12.7 | | | 18.5 | | | | 5.5 | | 2.1 | | 4.6 | 111.7 | 13.6 |
| Comp. Ex. 8 | 6.9 | 6.7 | | 31.3 | 50.9 | | | 1.7 | 2.5 | | | | | | | 100.0 | 57.6 |
| Comp. Ex. 9 | 7.3 | 8.2 | | 37.6 | 41.6 | | | | 2.2 | | 3.2 | | | | | 100.1 | 49.8 |
| Comp. Ex. 10 | 20.9 | 26.4 | | 21.2 | 26.1 | 1.7 | | | | | 3.7 | | | | | 100.0 | 52.5 |
| Comp. Ex. 11 | 13.3 | 24.1 | | 34.5 | | 1.4 | | 16.1 | 5.2 | | 3.1 | | | 2.3 | | 100.0 | 24.1 |
| Comp. Ex. 12 | 12.8 | 31.0 | | 36.0 | | | | 6.4 | 9.3 | | 4.5 | | | | | 100.0 | 31.0 |

TABLE 1-continued

| | | | | | | | | |
|---|---|---|---|---|---|---|---|---|
| Comp. Ex. 13 | 5.4 | 37.7 | 46.1 | 7.2 | 3.5 | 0.1 | 100.0 | 37.7 |

| | Glass fluidity [flow button diameter (mm)] | | | Water resistance Electrical conductivity | Si Reactivity Precipitated amount of |
|---|---|---|---|---|---|
| | 500° C. | 600° C. | 700° C. | (μS/cm) | reduced metal (−) |
| Ref. Ex. | 12.2 | 14.9 | 23.1 | 5.1-5.9 | 3.3 |
| Ex. 1 | 12.0 | 18.1 | 25.4 | 10.7 | 4.0 |
| Ex. 2 | 12.0 | 19.6 | 22.9 | 11.4 | 8.5 |
| Ex. 3 | 11.9 | 19.1 | 27.7 | 15.7 | 5.2 |
| Ex. 4 | 12.0 | 18.2 | 25.6 | 10.6 | 3.0 |
| Ex. 5 | 11.9 | 19.1 | 22.5 | 11.0 | 8.4 |
| Ex. 6 | 12.2 | 18.8 | 26.7 | 13.8 | 5.7 |
| Ex. 7 | 12.7 | 18.7 | 27.4 | 12.4 | 2.7 |
| Ex. 8 | 12.4 | 19.7 | 29.5 | 10.1 | 6.1 |
| Ex. 9 | 12.2 | 20.9 | 31.1 | 15.6 | 8.2 |
| Ex. 10 | 12.2 | 19.2 | 29.6 | 17.6 | 4.1 |
| Ex. 11 | 12.4 | 19.6 | 27.9 | 12.9 | 2.3 |
| Ex. 12 | 12.2 | 19.7 | 28.4 | 10.7 | 5.3 |
| Ex. 13 | 12.0 | 20.8 | 29.0 | 14.4 | 6.7 |
| Ex. 14 | 12.4 | 19.7 | 29.1 | 17.8 | 4.0 |
| Ex. 15 | 12.3 | 21.7 | 32.0 | 12.9 | 4.5 |
| Ex. 16 | 12.5 | 22.4 | 30.1 | 11.4 | 5.5 |
| Ex. 17 | 12.8 | 22.9 | 31.9 | 15.6 | 6.4 |
| Ex. 18 | 13.9 | 23.8 | 31.1 | 13.9 | 8.7 |
| Comp. Ex. 1 | x | x | x | 4.2 | 0.0 |
| Comp. Ex. 2 | x | 11.7 | 19.3 | Not evaluated | Not evaluated |
| Comp. Ex. 3 | x | 11.9 | 12.6 | Not evaluated | Not evaluated |
| Comp. Ex. 4 | x | 11.7 | 18.8 | 95.1 | Not evaluated |
| Comp. Ex. 5 | x | x | 11.7 | 71.7 | Not evaluated |
| Comp. Ex. 6 | x | x | x | 132.1 | Not evaluated |
| Comp. Ex. 7 | x | x | 13.6 | 59.4 | Not evaluated |
| Comp. Ex. 8 | x | 14.1 | 20.7 | 21.8 | 6.0 |
| Comp. Ex. 9 | x | 12.0 | 21.5 | 19.3 | 4.0 |
| Comp. Ex. 10 | 11.9 | 20.7 | 29.3 | 17.8 | 9.6 |
| Comp. Ex. 11 | 14.3 | 28.7 | 35.5 | 1974.0 | 14.6 |
| Comp. Ex. 12 | 12.3 | 20.8 | 30.9 | 675.0 | 13.9 |
| Comp. Ex. 13 | 17.4 | 17.7 | >50 | 299.0 | 13.5 |

As is evident from Table 1, with respect to the glass frits for forming electrodes in Comparative Examples 1 to 7 wherein the $SiO_2$ content was large, it was observed that they were generally hardly sintered, and even in a case where they were sintered, the glass fluidity became low. Further, with respect to the glass frits for forming electrodes in Comparative Examples 8 to 13 wherein the $SiO_2$ content was small, but $TiO_2$ was not contained, it was observed that except for some, sintering was possible, but even in such a case, the glass fluidity or the Si reactivity became too high, and the water resistance also became inadequate.

Whereas, with respect to the glass frits for forming electrodes in Examples 1 to 18 having the prescribed compositions, it was observed that they had glass fluidity, water resistance and Si reactivity close to the glass frit for forming an electrode in Reference Example containing lead, and thus they were suitable for forming light-emitting surface electrodes for solar cells.

INDUSTRIAL APPLICABILITY

According to the present invention, it is possible to provide a glass frit for forming an electrode which has glass fluidity and Si reactivity suitable for forming a light-receiving surface electrode for a solar cell, and sufficient water resistance, and it is possible to produce a solar cell excellent in the conversion efficiency or reliability such as water resistance by utilizing such a glass frit for forming an electrode.

This application is a continuation of PCT Application No. PCT/JP2010/060239 filed on Jun. 16, 2010, which is based upon and claims the benefit of priority from Japanese Patent Application No. 2009-144101 filed on Jun. 17, 2009. The contents of those applications are incorporated herein by reference in its entirety.

REFERENCE SYMBOLS

1: Solar cell, 11: semiconductor substrate, 12: light-receiving surface electrode, 13: antireflection layer, 14: aluminum back surface electrode, 15: silver or silver/aluminum back surface electrode, P: exothermic peak, S: peak area of exothermic peak

What is claimed is:

1. A glass frit for forming an electrode to be used for forming a light-receiving surface electrode for a solar cell, which comprises from 3 mol % to 20 mol % of $SiO_2$, from 10 mol % to 40 mol % of $Bi_2O_3$, from 15 mol % to 45 mol % of $B_2O_3$, from 10 mol % to 60 mol % of ZnO and from 2 mol % to 10 mol % of $TiO_2$, wherein the total content of $Bi_2O_3$ and ZnO is from 35 mol % to 70 mol %, which does not contain an alkali metal oxide, an alkaline earth metal oxide, iron oxide and aluminum oxide.

2. The glass frit for forming an electrode according to claim 1, which is a glass frit for forming an electrode to be used for forming a light-receiving surface electrode for a solar cell, which comprises from 4 mol % to 19 mol % of $SiO_2$, from 12 mol % to 37 mol % of $Bi_2O_3$, from 15 mol % to 43 mol % of $B_2O_3$, from 12 mol % to 55 mol % of ZnO and from 2 mol % to 9 mol % of $TiO_2$, wherein the total content of $Bi_2O_3$ and ZnO is from 37 mol % to 68 mol %.

3. The glass frit for forming an electrode according to claim 1, which has a flow button diameter of from 20 mm to 32 mm, representing the glass fluidity at 700° C.

4. The glass frit for forming an electrode according to claim 1, which has an extraction water conductivity of at most 20 µS/cm.

5. The glass frit for forming an electrode according to claim 1, which has a Si reactivity of from 2 to 9, as determined by utilizing DTA (differential thermal analysis).

6. An electrically conductive paste for forming an electrode, to be used for forming a light-receiving surface electrode for a solar cell, which comprises an electrically conductive silver powder, a glass frit and an organic vehicle, wherein the glass fit contains the glass frit for forming an electrode as defined in claim 1.

7. The electrically conductive paste for forming an electrode according to claim 6, wherein per 100 parts by mass of the electrically conductive silver powder, the glass frit is from 1 part by mass to 8 parts by mass, and the organic vehicle is from 10 parts by mass to 25 parts by mass.

8. A solar cell comprising a semiconductor substrate, a light-receiving surface electrode provided on a light-receiving surface side of the semiconductor substrate, and a back surface electrode provided on the back surface side of the semiconductor substrate, wherein the light-receiving surface electrode is one formed by baking the electrically conductive paste for forming an electrode as defined in claim 6.

* * * * *